«12» United States Patent
Blahnik

(10) Patent No.: US 6,347,918 B1
(45) Date of Patent: Feb. 19, 2002

(54) INFLATABLE SLIT/GATE VALVE

(75) Inventor: Jeff Blahnik, Austin, TX (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/238,251

(22) Filed: Jan. 27, 1999

(51) Int. Cl.⁷ .......................... F16K 3/28; F16K 25/00; F16K 31/126; F16K 51/02
(52) U.S. Cl. .................... 414/217; 251/167; 251/195
(58) Field of Search .................. 251/167, 195, 251/197; 414/217, 939

(56) References Cited

U.S. PATENT DOCUMENTS

| 3,040,773 A | | 6/1962 | McInerney | |
|---|---|---|---|---|
| 3,524,467 A | | 8/1970 | Worley | |
| 3,717,322 A | | 2/1973 | Bernard | |
| 3,785,612 A | | 1/1974 | Schertler | |
| 4,052,036 A | | 10/1977 | Schertler | |
| 4,070,001 A | | 1/1978 | Musgrove | |
| 4,075,787 A | | 2/1978 | Krahe | |
| 4,157,169 A | | 6/1979 | Norman | |
| 4,238,111 A | * | 12/1980 | Norman | 251/193 |
| 4,343,455 A | | 8/1982 | Winkler | |
| 4,381,100 A | | 4/1983 | Schoenberg | |
| 4,562,992 A | | 1/1986 | Sugisaki et al. | |
| 4,721,282 A | | 1/1988 | Shawver et al. | |
| 4,785,962 A | | 11/1988 | Toshima | |
| 4,921,213 A | | 5/1990 | Geiser | |
| 5,002,255 A | | 3/1991 | Sawa et al. | |
| 5,087,017 A | | 2/1992 | Sawa et al. | 251/175 |
| 5,116,023 A | | 5/1992 | Contin | |
| 5,120,019 A | | 6/1992 | Davis, Jr. | |
| 5,275,303 A | | 1/1994 | Szalai | |
| 5,363,872 A | | 11/1994 | Lorimer | |
| 5,379,983 A | | 1/1995 | Geiser | |
| 5,577,707 A | | 11/1996 | Brida | |
| 5,626,324 A | | 5/1997 | Nakamura et al. | |
| 5,695,564 A | | 12/1997 | Imahashi | |
| 5,820,104 A | | 10/1998 | Koyano et al. | |
| 5,971,358 A | * | 10/1999 | Kennedy | 251/197 |
| 5,975,492 A | * | 11/1999 | Brenes | 251/175 |
| 6,045,620 A | * | 4/2000 | Tepman et al. | 414/217 |
| 6,079,693 A | * | 6/2000 | Ettinger et al. | 251/195 |
| 6,089,543 A | * | 7/2000 | Freerks | 251/357 |

FOREIGN PATENT DOCUMENTS

| EP | 0 441 646 A1 | | 8/1991 |
|---|---|---|---|
| GB | 851444 | | 10/1960 |
| GB | 2240157 A | | 7/1991 |
| WO | 99/03132 | * | 1/1999 |
| WO | 99/28951 | * | 6/1999 |

OTHER PUBLICATIONS

VAT Series 19 Large Gate Valves Data Sheet, pp. 60–61.
VAT Series 48 All–Metal Gate Valve Data Sheet, pp. 106–107.
VAT Series 12 Vacuum Gate Valve Data Sheet, pp. 40–41.

* cited by examiner

Primary Examiner—James W. Keenan
(74) Attorney, Agent, or Firm—Dugan & Dugan LLP

(57) ABSTRACT

A sealable door assembly including a frontplate which faces an opening to be sealed, a backplate operatively coupled to the frontplate, and at least one inflatable member located between the frontplate and the backplate. When inflated, the inflatable member moves the frontplate into sealing engagement with the opening. In one embodiment the inflatable member includes one or more vacuum grade bellows. A movable mechanism moves the door assembly to selectively occlude the opening. Once the door assembly occludes the opening, the inflatable member is inflated and expands forcing the frontplate in a direction normal to the opening, thereby sealing the opening. The door assembly may be mounted within a pocket formed in an outer wall of a transfer chamber, and a sealing plate may be employed to form a gas tight region within the pocket. The gas tight region may be pressurized to enhance the door's seal of the opening.

12 Claims, 7 Drawing Sheets

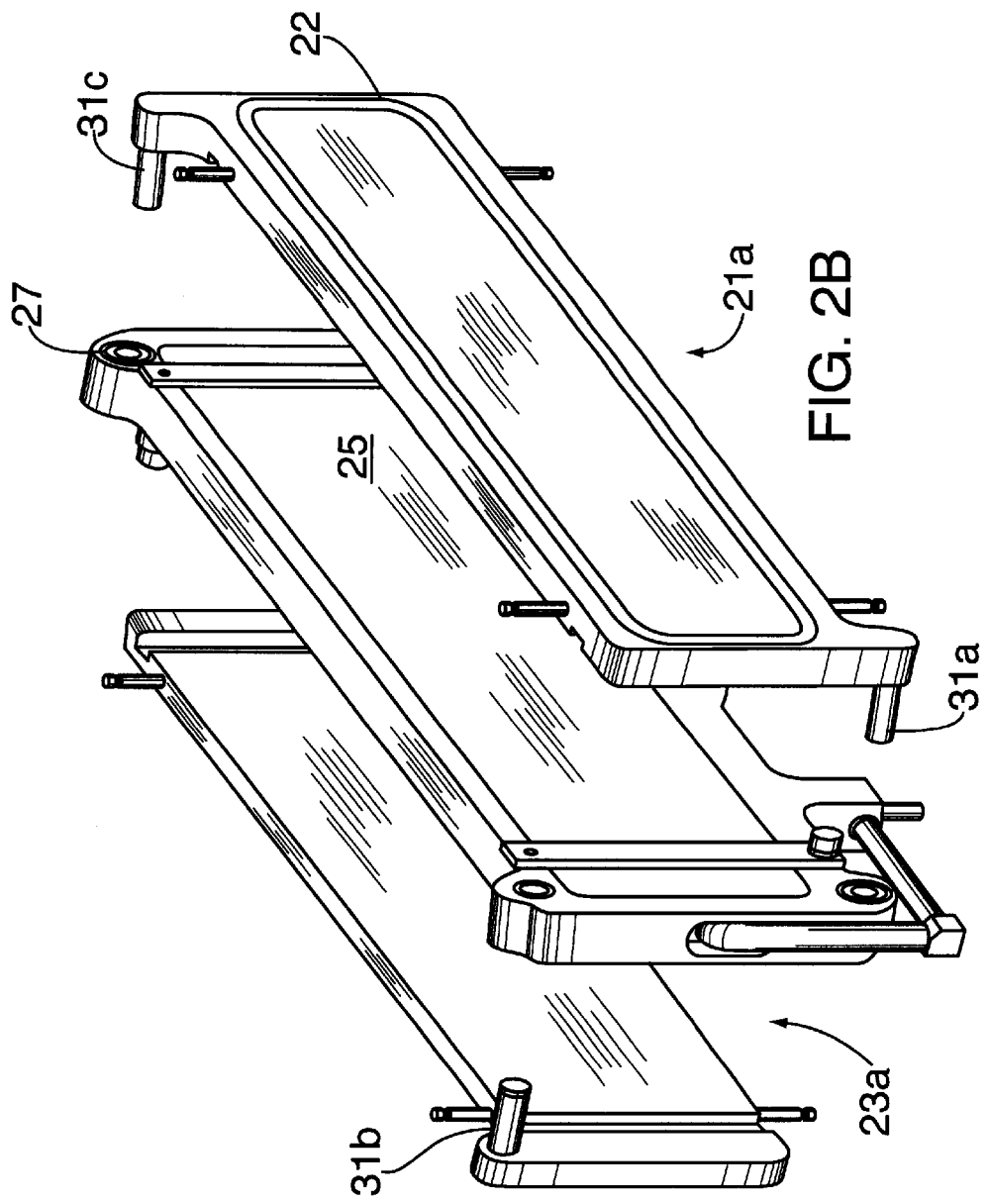
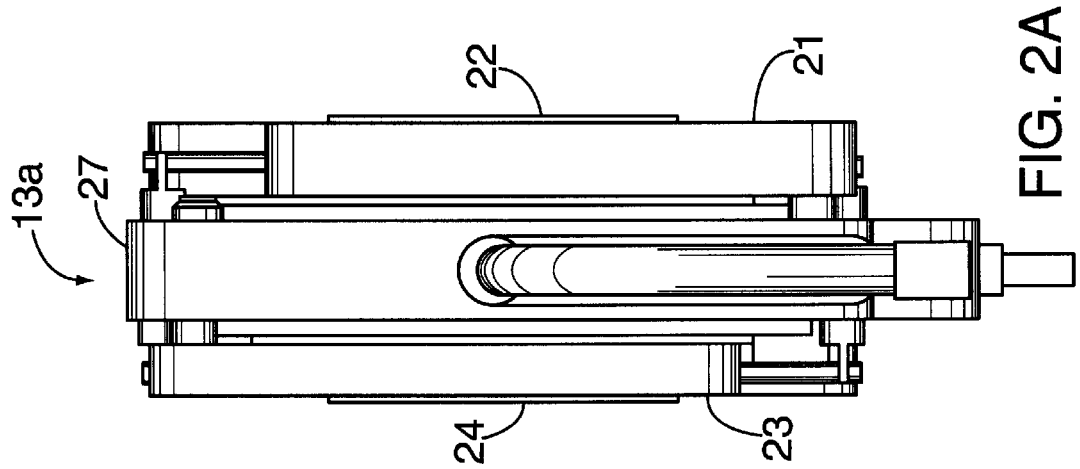

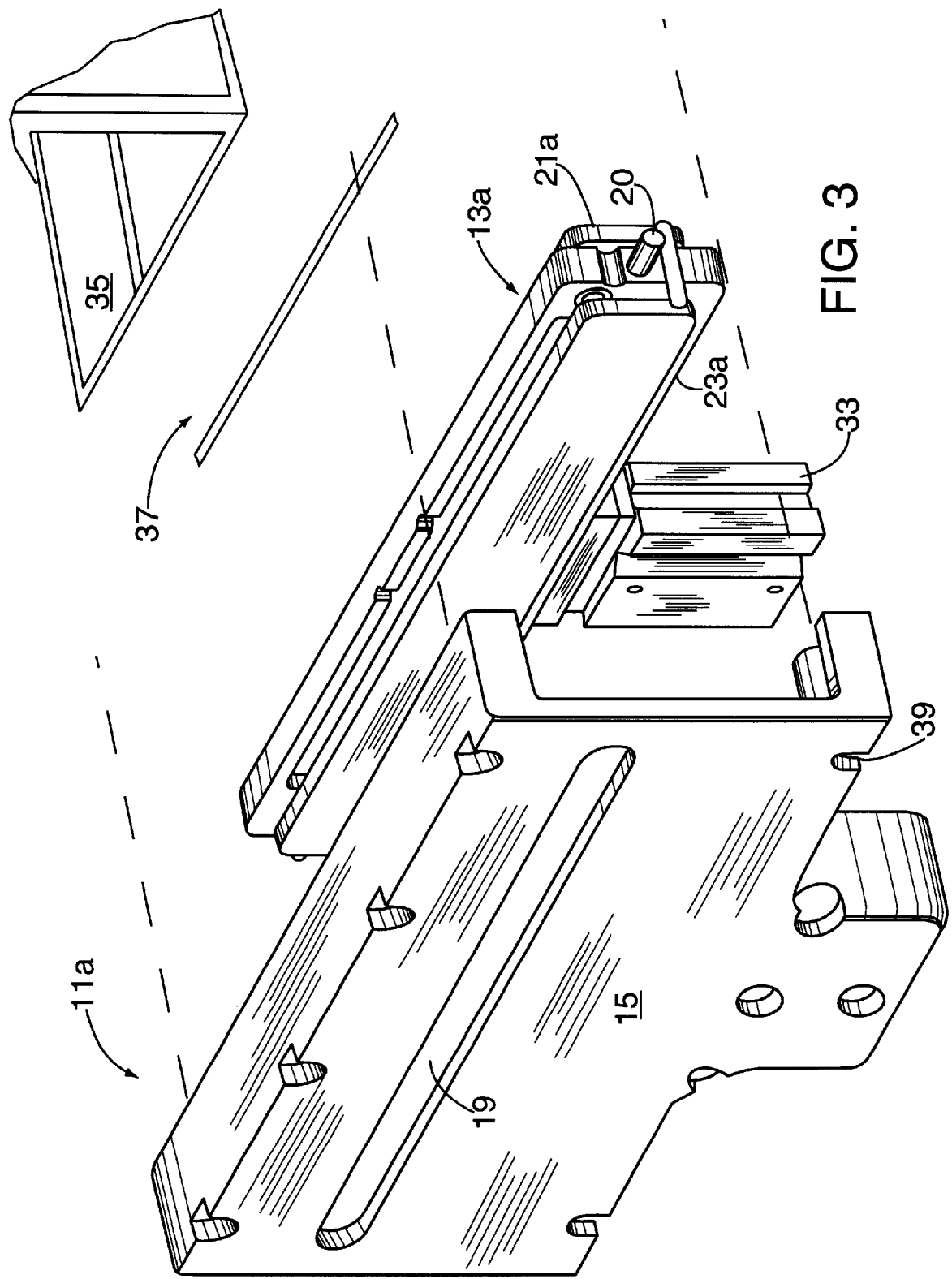

INFLATABLE SLIT/GATE VALVE

FIELD OF THE INVENTION

The present invention relates to methods and apparatuses for providing an automated gas tight seal of an opening. More particularly the present invention relates to a door assembly, such as a gate valve or slit valve, for sealing chambers of a semiconductor device fabrication tool.

BACKGROUND OF THE INVENTION

Semiconductor wafers are processed within automated fabrication tools comprising a plurality of chambers designated for wafer loading/unloading to and from the tool (i.e., a load lock), wafer transfer, or wafer processing. Typically the environment of each chamber must be selectively isolated from the environments of neighboring chambers to prevent cross contamination, and to enable the various chambers to be maintained at pressures that differ according to the process to be performed therein. Load locks also must be selectively isolated from the environment that exists outside the tool. To achieve such selective isolation, each chamber is provided with a slit through which wafer handlers extend to transport wafers to and from the chamber. The slit is selectively sealed with a moveable door (typically referred to as a slit valve for vacuum applications, and as a gate valve for non-vacuum applications). Conventional moveable door assemblies are bulky, consuming valuable clean room space, require many moving parts and frequent replacement. Moveable door assemblies therefore constitute a significant expense.

Many commonly used door assemblies are paddle shaped, having a sealing surface and having an elongated shaft portion that extends downward from the sealing surface. In operation the door assembly is elevated such that the sealing surface occludes the slit opening to be sealed. Thereafter, air cylinders located on the lower-shaft portion of the door assembly are actuated. The air cylinders push against the chamber wall, and thus simultaneously force the lower-shaft portion of the door away from the chamber, and force the sealing surface of the door assembly inward to seal the slit. Over time this cantilevering force bends the shaft, destroying any gas-tight seals located therealong. Further, the sealing surface moves toward the slit opening in a slightly arcing motion which causes the sealing surface to slide along the surface surrounding the slit. This sliding contact generates particles which may contaminate wafer surfaces.

Accordingly, these conventional door assemblies are bulky, expensive, unreliable and generate potentially destructive particles. A need therefore exists for an improved door assembly that is smaller, less expensive, more reliable, and that generates fewer particles than conventional door assemblies.

SUMMARY OF THE INVENTION

The present invention provides a moveable door assembly for selectively sealing an opening such as a slit opening of a semiconductor fabrication tool. The door assembly comprises a frontplate adapted to sealingly engage a surface having an opening to be sealed, a backplate operatively coupled to the frontplate, and at least one inflatable member located between the frontplate and the backplate for selectively moving the frontplate into sealing engagement with the opening. The frontplate has a sealing member to effect a gas tight seal around the opening. The frontplate is parallel to the surface having the opening to be sealed, and the inflatable member is coupled so as to move the frontplate in a direction normal to the surface to be sealed. In this manner, the inventive door assembly seals the opening without sliding along the surface which surrounds the opening, and without generating particles thereby.

When the inventive door assembly is configured for use in vacuum environments, the inflatable member comprises one or more vacuum grade members such as bellows made of stainless steel. In an embodiment preferred for vacuum applications, the inventive door assembly is housed within a pocket which is in communication with the opening to be sealed (e.g., within a pocket machined in the outer walls of a central chamber for transferring wafers). The door assembly has a movable mechanism for moving the door to and from a closed position wherein the door assembly occludes the opening. A sealing plate is coupled to the moveable mechanism, and is positioned to seal against the walls of the pocket, thereby creating a gas tight region within the pocket. By pressurizing the gas tight region, after sealing commences, the door assembly's seal is enhanced (due to the pressure gradient between the gas tight region and the chamber), and a smaller less expensive inflatable member may be employed.

Further advantages are achieved by employing a module having a plurality of bellows coupled to a single gas delivery line which passes through each bellows. Such a design allows the inflatable members and the gas delivery line to be easily replaced or repaired, and renders the design easily scaleable.

Other objects, features and advantages of the present invention will become more fully apparent from the following detailed description of the preferred embodiments, the appended claims and the accompanying drawings.

BRIEF DESCRIPTION OF THE DRAWINGS

FIGS. 2A and 2B are a side elevational view and an exploded isometric view of the door of FIG. 1;

FIG. 3 is an exploded isometric view of the inventive door assembly of FIG. 1, shown relative to a load lock chamber;

DETAILED DESCRIPTION OF THE DRAWINGS

Figure 1:
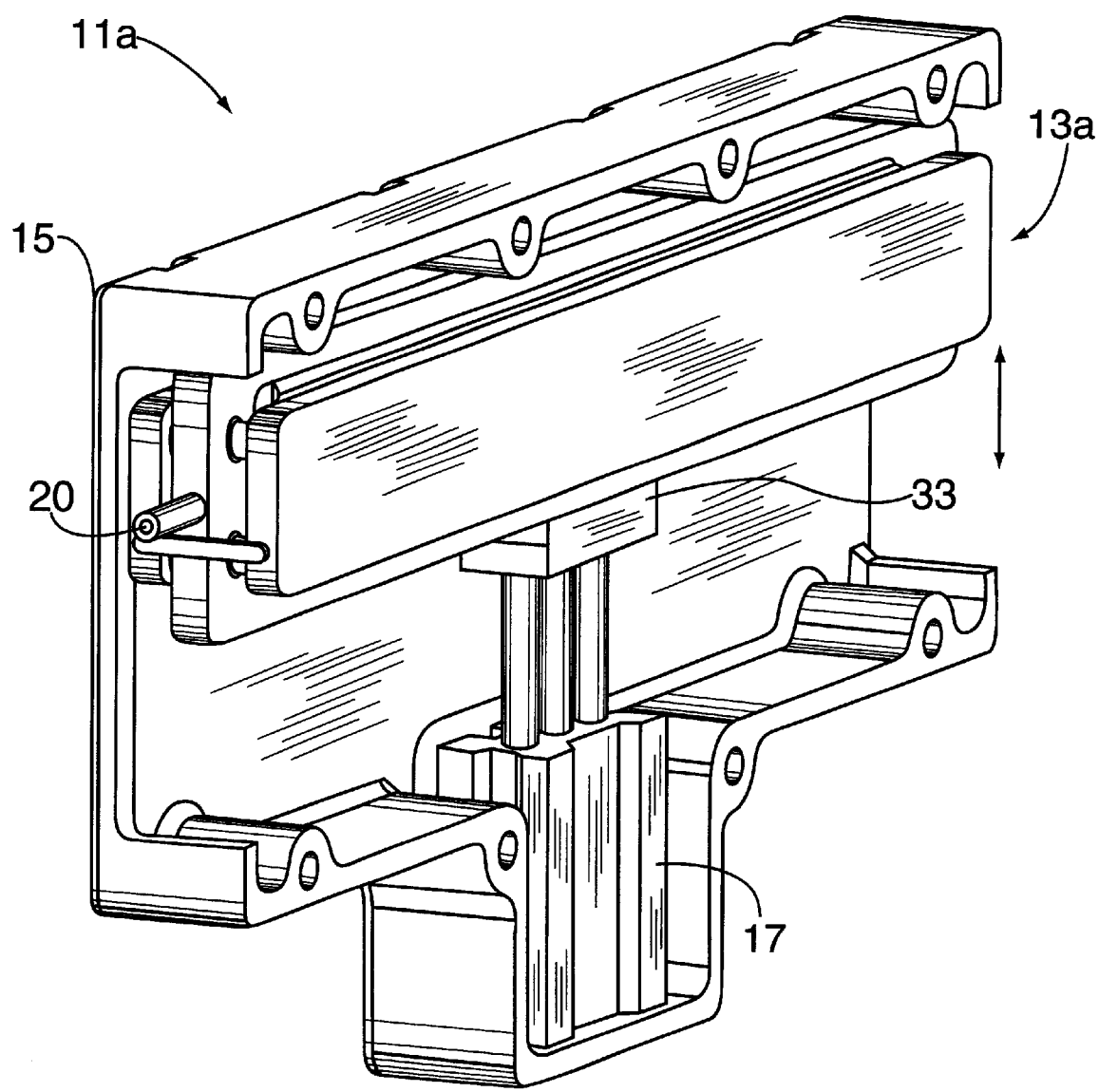
FIG. 1 is an isometric view of a first embodiment of an inventive door assembly.

FIG. 1 is an isometric view of a first embodiment of an inventive door assembly 11a. The door assembly 11a comprises a door 13 movably coupled within a housing 15 via a movement mechanism such as a guided pneumatic air cylinder lift 17. The air cylinder lift 17 is mounted to the housing 15, and configured to lift and lower the door 13 between an open position wherein the door 13 does not occlude an opening 19 (best shown in FIG. 3) and a closed position wherein the door 13 occludes the opening 19. A gas supply line 20 supplies gas from a remote source (not shown) to an inflatable member of the door 13 as further described with reference to FIGS. 2A and 2B.

FIGS. 2A and 2B are a side view and an exploded isometric view, respectively, of the door 13 of FIG. 1. The door 13 comprises a frontplate 21a, a backplate 23a, and an inflatable member, such as an inflatable bladder 25, operatively coupled between the frontplate 21a and the backplate 23a. The inflatable bladder 25 is supported by a frame 27. A plurality of springs 31a–c couple to both the frontplate 21a and the backplate 23a so as to bias the frontplate 21a and the backplate 23a toward each other, yet extend to allow the frontplate 21a and the backplate 23a to move away from each other a distance sufficient to seal against an opening in a chamber (FIG. 3) and the opening 19 of the housing 15 (FIG. 1). The frontplate 21a, the backplate 23a and the frame 27 are bolted to the top of the air cylinder lift 17 via a mounting block 33 (best shown in FIG. 1). The frontplate 21a and the backplate 23a preferably have a sealing member 22, 24, respectively, on the outer surfaces thereof. The frontplate 21a and backplate 23a preferably comprise a corrosion resistant material such as stainless steel, aluminum or nickel-plated aluminum, etc. The frontplate 21a and the backplate 23a are sized so as to seal around an opening in a chamber (FIG. 3), and the opening 19 of the housing 15 (FIG. 1) as further described with reference to FIG. 3.

FIG. 3 is an exploded isometric view of the inventive door assembly 11a of FIG. 1, showing the door assembly 11a exploded from a load lock chamber 35. The load lock chamber 35 has a slit opening 37 formed therein. The housing 15 is bolted to the front of the load lock chamber 35, via bolts (not shown) which extend through a plurality of bolt holes 39. The slit opening 37 of the load lock chamber 35 and the opening 19 of the housing 15 are aligned and sized such that a wafer handler (not shown) may pass a wafer between the ambient environment outside the housing 15 and the interior region of the load lock chamber 35.

As shown in FIG. 3, the air cylinder lift 17 is in the down position such that the door 13 coupled thereto is in the open position. In the open position the door 13 is sufficiently below the level of the opening 19 of the housing 15 and the slit opening 37 of the load lock chamber 35 so as to allow a wafer handler to pass therebetween. In operation, after a wafer has been inserted or extracted through the openings 19 and 37, the air cylinder lift 17 is energized and travels to the closed position such that the door 13 coupled thereto occludes the opening 19 of the housing 15 and occludes the slit opening 37 of the load lock chamber 35. Thereafter, gas (e.g., air, nitrogen, etc.) is supplied to the inflatable bladder 25 via the gas supply line 20. The gas inflates the inflatable bladder 25 which in turn simultaneously forces the sealing member 22 of the frontplate 21a against the housing 15, and forces the sealing member 24 of the backplate 23a against the load lock chamber 35. The frontplate's sealing member 22 thereby seals around the opening 19, and the backplate's sealing member 24 seals around the slit opening 37. In the example of FIG. 3, the sealing member 24 of the backplate 23a can be omitted, as it is not necessary to seal the opening 19 which leads to the ambient environment rather than to another chamber.

To open the door assembly, the inflatable bladder 25 is deflated by de-energizing a solenoid valve (not shown) which is part of the fabrication tools main frame, and venting the inflatable bladder 25 and the gas supply line to atmosphere. As the inflatable bladder 25 deflates the springs 31a–c draw the frontplate 21a and the backplate 23a toward each other. After the frontplate 21a and the backplate 23a are drawn a sufficient distance from the load lock chamber 35 and the housing 15, respectively, the air cylinder lift 17 lowers the door 13 so that the door 13 no longer occludes the slit opening 37 and the opening 19.

Figure 4:
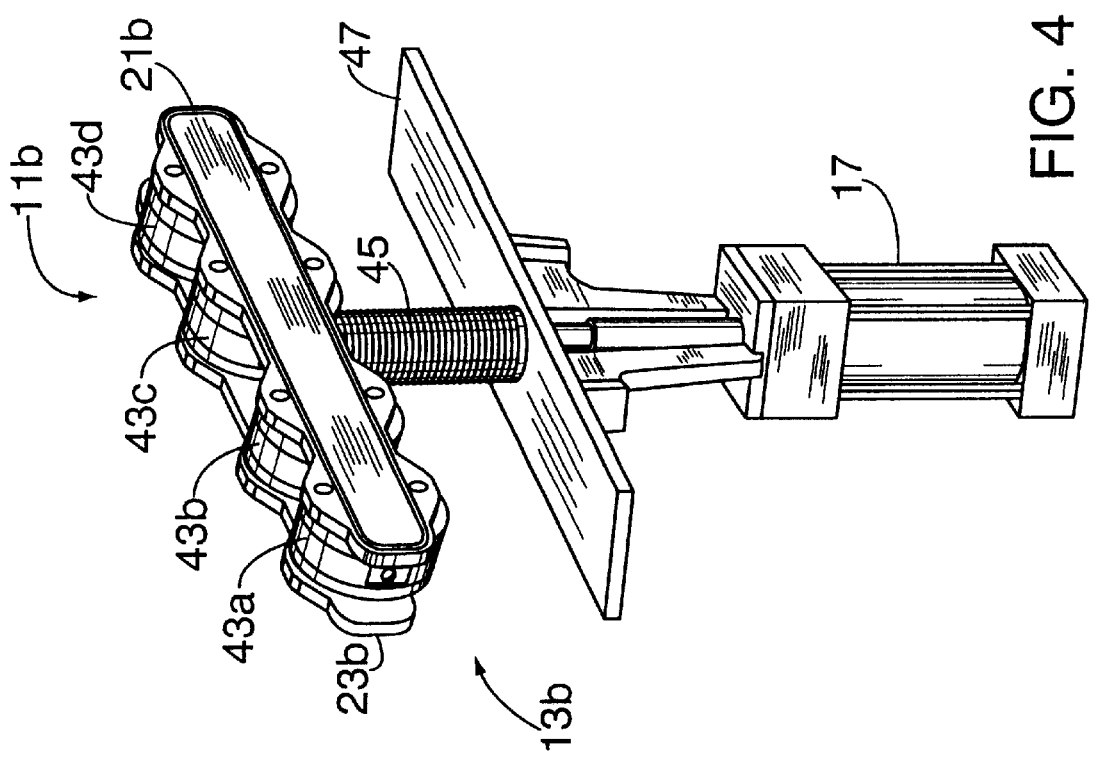
FIG. 4 is an isometric view of a second embodiment of the inventive door assembly.

FIG. 4 is an isometric view of a second embodiment of the inventive door assembly. Throughout FIGS. 1–8, components of the first embodiment and the second embodiment of the inventive door assembly which are similar but not identical are indicated as "a" and "b", respectively. The door assembly 11b of FIGS. 4–7 is configured like the door assembly 11a of FIGS. 1–3, but has been modified slightly to allow for use within a vacuum environment. Specifically, the inflatable member of the door assembly 11b is comprised of a vacuum grade material (e.g., stainless steel or Inconel 625® manufactured by INCO, Inc.). As shown in FIG. 4, the preferred inflatable member comprises four vacuum grade bellows 43a–d and a vertical vacuum grade bellows 45 which encases the shaft of the air cylinder lift 17 and encases a first gas supply line (see FIG. 6). The door assembly 11b also has a sealing plate 47 operatively coupled to the air cylinder lift 17 (e.g., such that the shaft of the air cylinder lift 17 passes through the sealing plate 47, allowing the sealing plate 47 to remain stationary while the shaft lifts and lowers the door assembly 11b).

Figure 5:
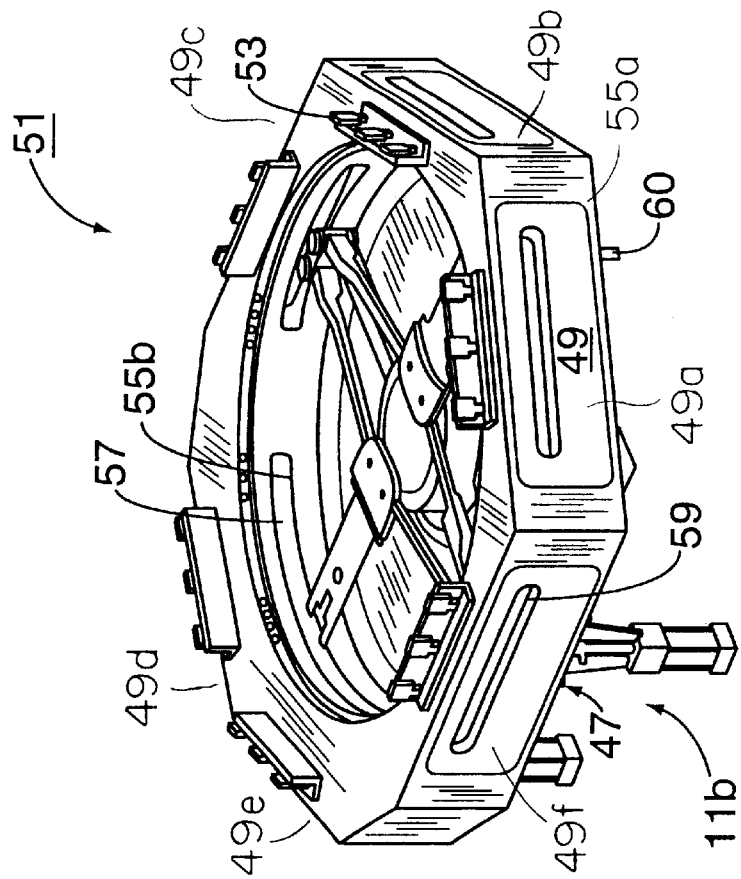
FIG. 5 is an isometric view of a typical transfer chamber 53 having the inventive door assembly of FIG. 4 mounted thereto.

In practice the door assembly 11b preferably is mounted inside a pocket 49 (FIG. 5) machined within a chamber wall 51 (FIG. 5), and the sealing plate 47 is configured to seal an open side (e.g., the bottom) of the pocket 49, thereby creating a gas tight region as described further with reference to FIG. 5.

FIG. 5 is an isometric view of a typical transfer chamber 51 having the inventive door assembly of FIG. 4 mounted thereto. The transfer chamber 51 has a thick outer wall 53, in which a plurality of pockets 49a–f are machined. Conventionally, each pocket 49a–f is supplied with an inner and an outer pocket wall 55a, 55b having an inner slit opening 57 and an outer slit opening 59, respectively. The bottom of the pocket 49 conventionally is left open to receive a door assembly (e.g., a slit valve) therethrough. The sealing plate 47 is sized so as to seal against the side walls of the pocket 49, and has a groove containing an o-ring (not shown) which seals against the side walls of the pocket 49. Thus, when the door assembly 11b is mounted inside the pocket 49, the pocket 49 forms a gas tight region. In operation the air cylinder lift 17 lifts and lowers the door 13b between a closed position wherein the door 13b occludes the inner slit opening 57 and the outer slit opening 59 of the pocket, and an open position wherein the door 13b does not occlude the inner slit opening 57 and the outer slit opening 59 of the pocket. When in the closed position, the door 13b inflates, forming a seal around the inner slit opening 57 and the outer slit opening 59, as described further with reference to FIGS. 6 and 7.

After sealing commences the gas tight region may be pressurized by a mechanism operatively coupled thereto (e.g., by opening a solenoid valve 60 of the fabrication tool's mainframe) and by flowing a compressible fluid into the gas tight region via the mechanism. The compressible fluid generates the force required to seal the inner slit opening 57 and the outer slit opening 59 by creating a pressure gradient between the gas tight region and the processing region of the chamber. This pressure gradient enhances the seal, enabling use of a smaller, less expensive inflatable member.

Figure 6:
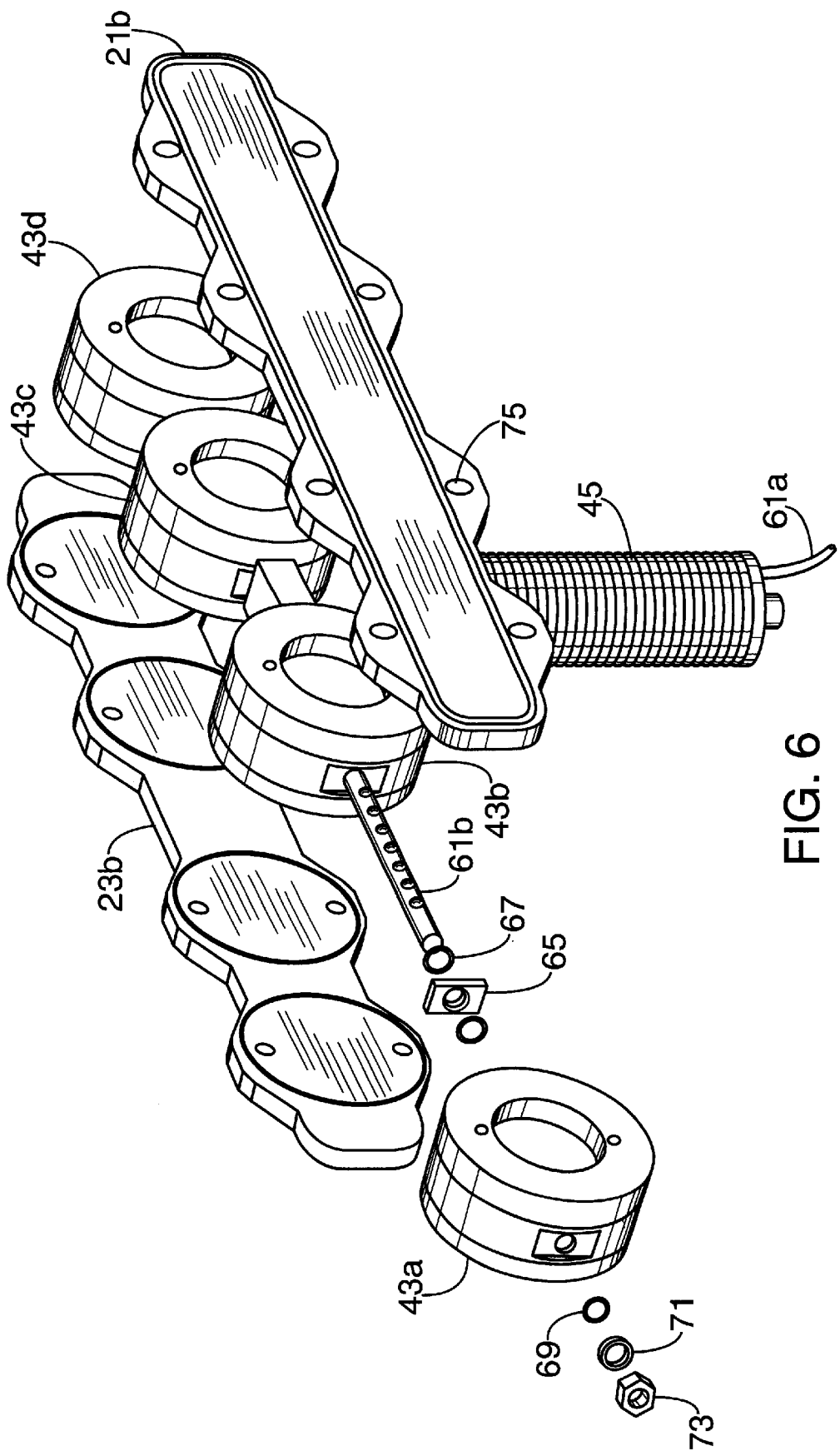
FIG. 6 is an exploded isometric view of the inventive door of FIG. 4.
Figure 7:
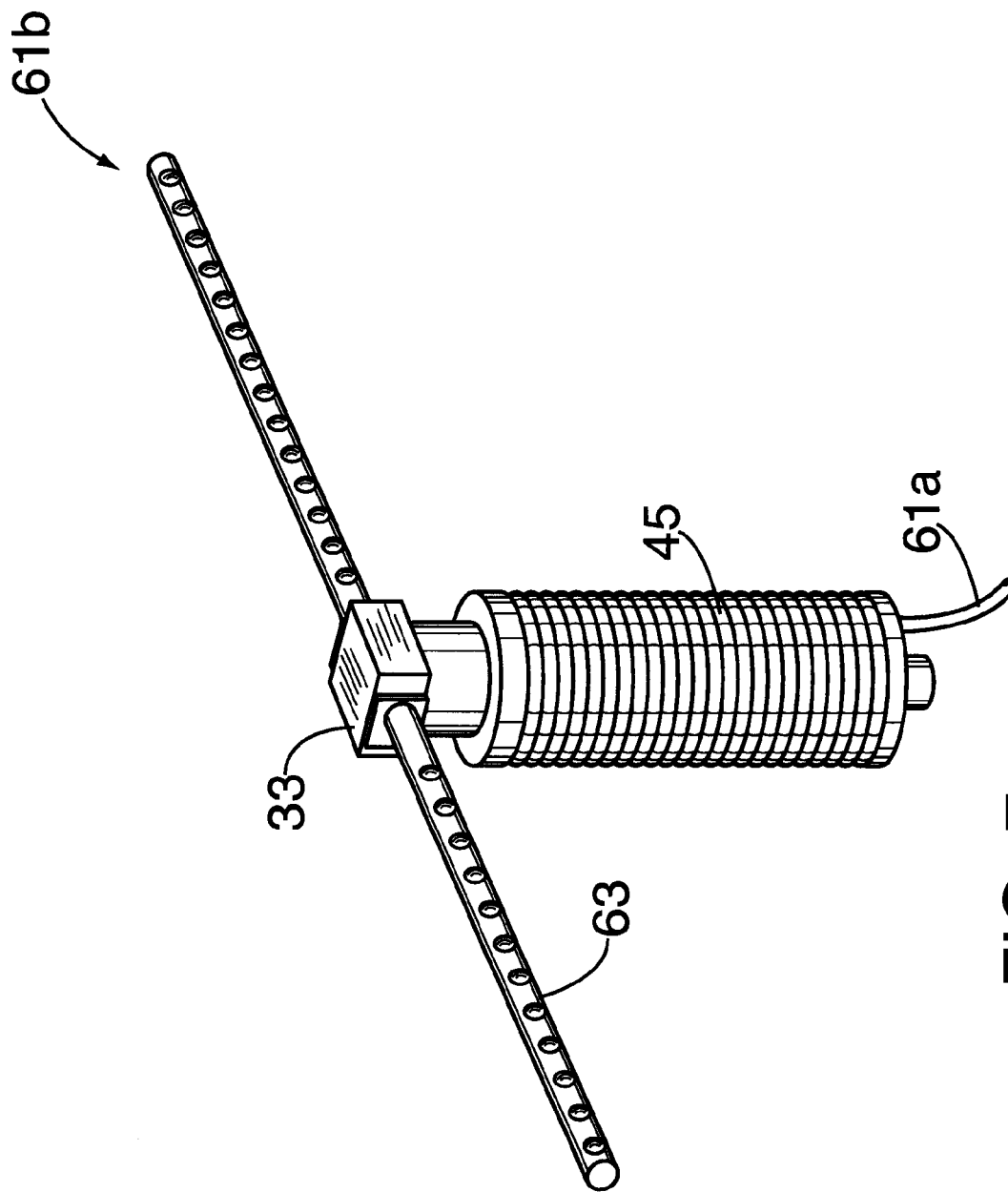
FIG. 7 is an isometric view of the gas supply for the inventive door of FIG. 6.

FIG. 6 is an exploded isometric view of the inventive door 13b of the door assembly 11b of FIG. 4, and FIG. 7 is an isometric view of the gas supply for the inventive door 13b.

A gas supply system for the vacuum grade bellows 43a–d comprises a first gas line 61a which supplies gas from a gas source (not shown) through the vertical vacuum grade bellows 45 to the mounting block 33. Within the mounting block 33 the first gas line 61a couples to a second gas line 61b. The second gas supply line 61b and the vacuum grade bellows 43a–d are preferably designed so that they may be removed as a unit (i.e., are modular). The second gas line 61b is preferably a rigid member (e.g., comprised of stainless steel tubing) and has a plurality of openings 63 formed therein. The vacuum grade bellows 43a–d are mounted on the second gas line 61b, and gas is supplied to the vacuum grade bellows 43a–d via the openings 63 in the second gas line 61b. A pneumatic seal 65 having o-rings 67 on each side thereof, is mounted on the second gas line 61b between each vacuum grade bellows 45a–d. On each end of the second gas line 61b an end o-ring 69, a washer 71 and a nut 73 are mounted as shown in FIG. 6. Thus, when mounted on the second gas line 61b, the bellows 43a–d are easily held together by tightening the nut 73.

The frontplate 21b and the backplate 23b of the door assembly 11b preferably are shaped to receive the bellows 43a–d as shown in FIGS. 4 and 6, and have bolt holes 75 and bolts (not shown) which extend into the vacuum grade bellows 43a–d. Thus, the module comprising the vacuum grade bellows 43a–d and the second gas line 61b is easily separable from the frontplate 21b and the backplate 23b, facilitating assembly and repair.

Figure 8:
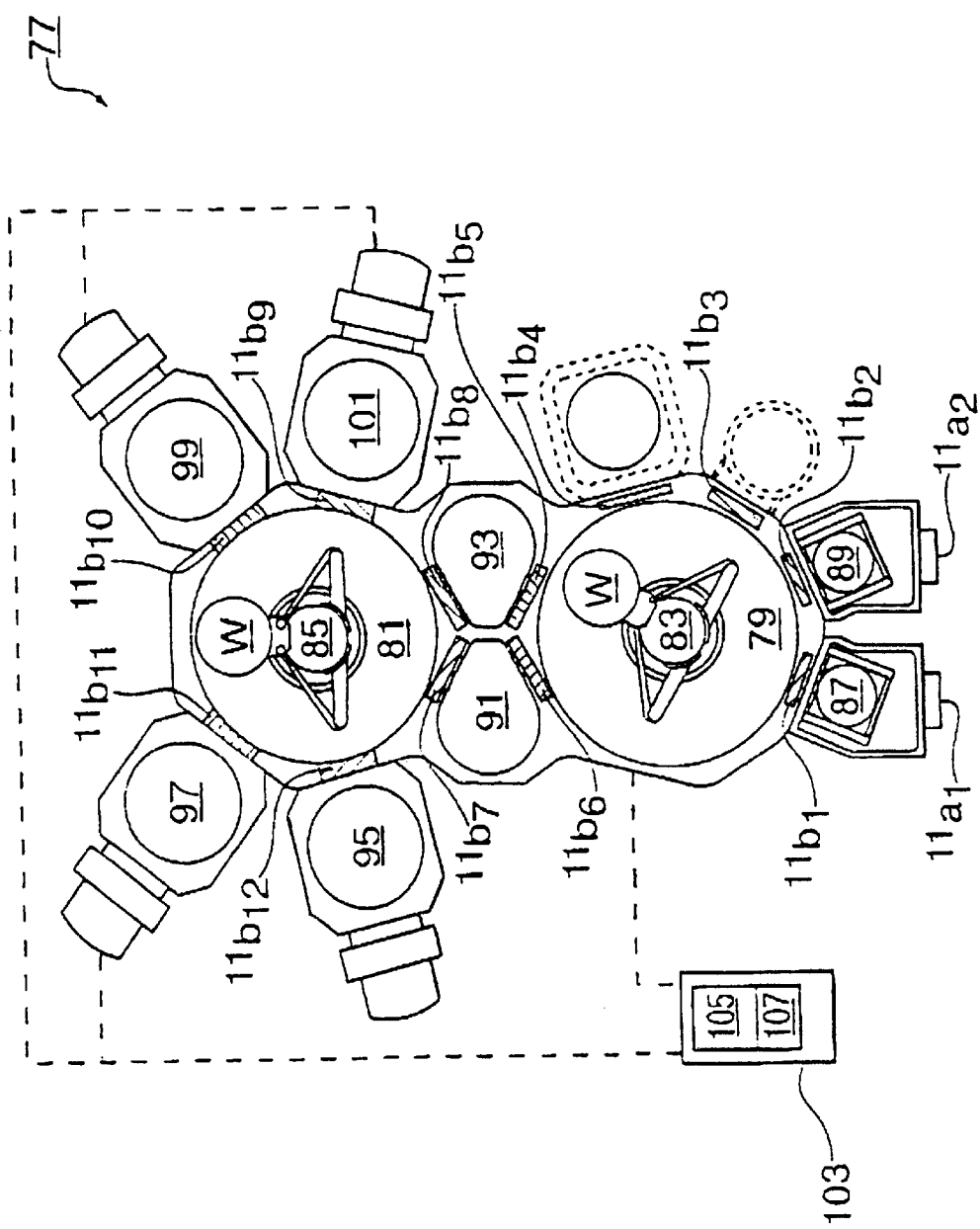
FIG. 8 is a top plan view of an automated semiconductor device fabrication tool comprising the inventive door assemblies of FIGS. 1 and 4.

FIG. 8 is a top plan view of an automated semiconductor device fabrication tool 77 which employs the inventive door assembly 11a of FIG. 1 and the inventive door assembly 11b of FIG. 4. The fabrication tool 77 comprises a first transfer chamber 79 and a second transfer chamber 81, which house a first and a second wafer handler 83, 85, respectively. The first transfer chamber 79 is operatively coupled to a pair of load locks 87, 89 and to a pair of pass-through chambers 91, 93. Other chambers such as degassing or cool-down chambers (shown in phantom) also may be coupled to the first transfer chamber 79. The second transfer chamber 81 is coupled to the pass-through chambers 91, 93, and to a plurality of processing chambers 95, 97, 99 and 101 which are configured for performing various semiconductor fabrication processes (e.g., chemical vapor deposition, sputter deposition, etc.).

Each chamber of the fabrication tool 77 is sealed by one or more of the inventive door assemblies 11a, 11b. A first and second inventive door assembly $11a_1$, $11a_2$ respectively seal the load lock chambers 87, 89 from atmosphere. Because the remaining seals occur between two vacuum environments, the door assembly 11b of FIG. 4 is employed, as it is configured for use within a vacuum environment and for installation within a chamber wall. Accordingly, a first through a sixth door assembly $11b_{1-6}$ is installed within the wall of the first transfer chamber 79 and a seventh through a twelfth door assembly $11b_{7-12}$ is installed within the wall of the second transfer chamber 81. A controller 103 comprising a microprocessor 105 and memory 107 is operatively coupled to the first and second wafer handlers 83, 85, to the load locks 87, 89, and to the door assemblies $11a_{1-2}$, $11b_{1-12}$ which selectively seal the load locks, pass-through chambers and processing chambers. The controller 103 thus controls wafer transfer and processing within the fabrication tool 77.

The door assembly 11b of the present invention requires less space and therefore enables the overall footprint of the first transfer chamber 79 and the second transfer chamber 81 to be reduced which reduces clean room costs. This savings, paired with the increased reliability, the superior seals, the longer life and the reduced cost of the inventive door assembly 11b, makes the inventive door assembly 11a, 11b far superior to conventional slit valves and/or gate valves used in semiconductor fabrication tools. Alternatively, rather than reducing the footprint of the transfer chamber 79, the transfer chamber 79 may be maintained at its conventional size, in which case the inventive door assembly's smaller size provides increased space for robot operating volume and allows use of robots with longer extended arm lengths.

The foregoing description discloses only the preferred embodiments of the invention, modifications of the above disclosed apparatus and method which fall within the scope of the invention will be readily apparent to those of ordinary skill in the art. For instance, a sealing member such as an o-ring may be mounted on the door assembly housing, on the load lock chamber, or on the inner or outer walls of the pocket, rather than on the front and backplates of the inventive door assembly. In such arrangements the front and backplates are still considered to be adapted to sealingly engage the respective surface. Further, the shape of the various components and the specific coupling therebetween may vary. The inventive door assembly may be easily scaled (e.g., for use in 200 mm or 300 mm wafer systems) by changing the size of the housing, the size of the various plates and the size of the inflatable member. When inflatable bellows are employed their number may be increased or decreased to easily achieve the desired size. Further, although the portion of the frontplate adapted to seal around the opening is preferably parallel to the surface against which it seals, the frontplate may be comprised of a number of portions having various orientations.

Accordingly, while the present invention has been disclosed in connection with the preferred embodiments thereof, it should be understood that other embodiments may fall within the spirit and scope of the invention, as defined by the following claims.

The invention claimed is:

1. A vacuum chamber comprising:
   an enclosure wall;
   a pocket machined in the enclosure wall having an inner pocket wall with an inner opening, and an outer pocket wall with an outer opening in line with the inner opening;
   a movable mechanism coupled within the pocket;
   a door assembly including:
      a door having:
         a frontplate adapted to sealingly engage the outer pocket wall to seal the outer opening;
         a backplate operatively coupled to the frontplate; and
         at least one inflatable member located between the frontplate and the backplate for selectively moving the frontplate into sealing engagement with the outer opening, the inflatable member comprising a vacuum grade member;
      the door assembly being mounted to the movable mechanism so as to move between a closed position wherein the door occludes the inner and the outer openings, and an open position wherein the door does not occlude the inner or the outer opening;
   a sealing plate different from the frontplate and the backplate and operatively coupled to the movable mechanism, the sealing plate being positioned so as to seal against the inner and outer walls of the pocket, thereby creating a gas tight region within the pocket and adjacent the inner and the outer openings; and
   a mechanism operatively connected to the gas tight region for supplying gas thereto.

2. The vacuum chamber of claim 1 wherein the frontplate of the door is parallel to the outer pocket wall, the backplate of the door is parallel to the inner pocket wall, and wherein the inflatable member is coupled so as to move the frontplate in a direction normal to the outer pocket wall, so as to move the backplate in a direction normal to the inner pocket wall, and so as to press the frontplate against the outer pocket wall, while pressing the backplate against the inner pocket wall.

3. The vacuum chamber of claim 2 wherein the inflatable member comprises a plurality of vacuum grade bellows.

4. The vacuum chamber of claim 3 further comprising:
   a gas delivery line having a plurality of outlets therein, wherein the plurality of vacuum grade bellows are operatively coupled to the gas delivery line to receive gas through the outlets, and so as to form a modular unit with the gas delivery line.

5. An automated semiconductor fabrication tool comprising:
   the vacuum chamber of 3 claim having a wafer handler positioned inside an enclosed region formed by the enclosure wall; and
   a processing chamber, for processing semiconductor wafers, operatively coupled to the outer opening of the pocket.

6. An automated semiconductor fabrication tool comprising:
   the vacuum chamber of claim 2 having a wafer handler positioned inside an enclosed region formed by the enclosure wall; and
   a processing chamber for processing semiconductor wafers operatively coupled to the outer opening of the pocket.

7. An automated semiconductor fabrication tool comprising:
   the vacuum chamber of claim 2 having a wafer handler positioned inside an enclosed region formed by the enclosure wall; and
   a load lock chamber operatively coupled to the outer opening of the pocket for loading and unloading semiconductor wafers to and from the fabrication tool.

8. An automated semiconductor fabrication tool comprising:
   the vacuum chamber of claim 1 having a wafer handler positioned inside an enclosed region formed by the enclosure wall; and
   a load lock chamber operatively coupled to the outer opening of the pocket for loading and unloading semiconductor wafers to and from the fabrication tool.

9. The vacuum chamber of claim 1, wherein the frontplate and the backplate are vertically oriented and the sealing plate is horizontally oriented.

10. The vacuum chamber of claim 9, wherein the movable mechanism includes an air cylinder lift having a shaft, and the shaft of the air cylinder lift passes through the sealing plate.

11. The vacuum chamber of claim 10, wherein the sealing plate remains stationary while the shaft lifts and lowers the sealable door assembly.

12. The vacuum chamber of claim 11, further comprising a vertical bellows which encases the shaft of the air cylinder lift.

* * * * *